US008680491B2

(12) United States Patent
Tanjo

(10) Patent No.: US 8,680,491 B2
(45) Date of Patent: Mar. 25, 2014

(54) METHOD OF CONTROLLING ION IMPLANTATION APPARATUS

(75) Inventor: Masayasu Tanjo, Kyoto (JP)

(73) Assignee: Nissin Ion Equipment Co., Ltd, Kyoto (JP)

( * ) Notice: Subject to any disclaimer, the term of this patent is extended or adjusted under 35 U.S.C. 154(b) by 145 days.

(21) Appl. No.: 13/409,984

(22) Filed: Mar. 1, 2012

(65) Prior Publication Data

US 2012/0286153 A1 Nov. 15, 2012

(30) Foreign Application Priority Data

May 10, 2011 (JP) ................................ 2011-104934

(51) Int. Cl.
*H01J 37/00* (2006.01)

(52) U.S. Cl.
USPC .................... 250/492.3; 250/492.21; 250/282

(58) Field of Classification Search
CPC .................................. H01J 37/00; G21K 5/04
USPC ...................................................... 250/492.3
See application file for complete search history.

(56) References Cited

U.S. PATENT DOCUMENTS 4,578,589 A * 3/1986 Aitken ........................ 250/492.2
5,189,303 A * 2/1993 Tanjyo et al. ................. 250/296
7,435,976 B2 * 10/2008 Naito et al. .............. 250/492.21
7,820,986 B2 * 10/2010 Lubicki et al. ........... 250/492.21

FOREIGN PATENT DOCUMENTS

JP 08-115701 A 5/1996
JP 3487057 B2 10/2003

* cited by examiner

*Primary Examiner* — Phillip A Johnston
(74) *Attorney, Agent, or Firm* — Procopio, Cory, Hargreaves & Savitch LLP

(57) ABSTRACT

Provided is a method of controlling an ion implantation apparatus 100 which includes: a mass separator 3 for sorting out and outputting ions having a specific mass number and valence from an ion beam IB extracted from an ion source 2; an acceleration tube 4 for accelerating or decelerating the ion beam IB output from the mass separator 3; and an energy separator 5 for sorting out and outputting ions having a specific energy from the ion beam IB output from the acceleration tube 4. The method comprises, during an acceleration mode, controlling an acceleration voltage $V_A$ such that it is prevented from becoming 0 kV.

5 Claims, 4 Drawing Sheets

METHOD OF CONTROLLING ION IMPLANTATION APPARATUS

BACKGROUND OF THE INVENTION

1. Field of the Invention

The present invention relates to a method of controlling an ion implantation apparatus.

2. Description of the Background Art

Heretofore, as an ion implantation apparatus, there has been known one type which comprises a mass separation magnet for sorting out and outputting ions having a specific mass number and valence from an ion beam extracted from an ion source, an acceleration tube for accelerating or decelerating the ion beam output from the mass separation magnet, and an energy separation magnet for sorting out and outputting ions having a specific energy from the ion beam output from the acceleration tube, as disclosed, for example, in Patent Document 1.

In this type of ion implantation apparatus, a curvature radius of the ion beam in the energy separation magnet is calculated based on a value of magnetic flux density in the energy separation magnet at each checkup timing before and during ion implantation into a target, a mass number and valence of ion at the checkup timing and a total applied voltage to the ion beam, and it is checked whether the calculated curvature radius falls within a predetermined allowable range with respect to a reference value. This approach is intended to properly detect abnormality in ion species and energy of the ion beam, in the above manner.

However, in the above abnormality detection method, the Patent Document 1 makes no mention of abnormality caused by discharge of an extraction electrode to which an extraction voltage is applied to extract an ion beam from the ion source. In cases where a plurality of types of ions are generated in the ion source, discharge occurring in the extraction electrode gives rise to a problem that an ion beam containing the plurality of types of ions will reach a target, and ions having a mass and energy other than desired values (i.e., non-desired ions) will be implanted into the target.

LIST OF PRIOR ART DOCUMENTS

Patent Documents

Patent Document 1: JP 08-115701A

SUMMARY

Problem to be Solved by the Invention

In view of the above problem, it is a primary object of the present invention to prevent the occurrence of a situation where, due to discharge of an extraction electrode, an ion beam generated in an ion source to contain a plurality of types of ions reaches a target, and ions having a mass and energy other than desired values are implanted into the target.

Means for Solving the Problem

According to one aspect of the present invention, there is provided a method of controlling an ion implantation apparatus, wherein the ion implantation apparatus includes: a mass separator for sorting out and outputting ions having a specific mass number and valence from an ion beam extracted from an ion source; an acceleration tube for accelerating or decelerating the ion beam output from the mass separator; and an energy separator for sorting out and outputting ions having a specific energy from the ion beam output from the acceleration tube. The method comprises, during an acceleration mode of operation in which the ion beam is accelerated by the acceleration tube, controlling an acceleration voltage to be applied to the acceleration tube, in such a manner that it is prevented from becoming 0 kV.

In this method, during the acceleration mode of operation, the acceleration voltage is controlled to be prevented from becoming 0 kV. Thus, even if discharge occurs in an extraction electrode for extracting an ion beam from the ion source, non-desired ions generated in the ion source can be separated through the energy separator, so that it becomes possible to allow only desired ions to reach a target. Detailed functions will be described later.

According to another aspect of the present invention, there is provided a method of controlling an ion implantation apparatus, wherein the ion implantation apparatus includes: a mass separator for sorting out and outputting ions having a specific mass number and valence from an ion beam extracted from an ion source; an acceleration tube for accelerating or decelerating the ion beam output from the mass separator; and an energy separator for sorting out and outputting ions having a specific energy from the ion beam output from the acceleration tube. The method comprises, during a deceleration mode of operation in which the ion beam is decelerated by the acceleration tube, controlling an extraction voltage for extracting an ion beam from the ion source, and a deceleration voltage to be applied to the acceleration tube, in such a manner that respective values thereof become different from each other.

In this method, during the deceleration mode of operation, the extraction voltage and the deceleration voltage are controlled such that respective values thereof become different from each other. Thus, even if discharge occurs in an extraction electrode for extracting an ion beam from the ion source, non-desired ions generated in the ion source can be separated through the energy separator, so that it becomes possible to allow only desired ions to reach a target. Detailed functions will be described later.

According to another aspect of the present invention, there is provided a method of controlling an ion implantation apparatus, wherein the ion implantation apparatus includes: a mass separator for sorting out and outputting ions having a specific mass number and valence from an ion beam extracted from an ion source; an acceleration tube for accelerating or decelerating the ion beam output from the mass separator; and an energy separator for sorting out and outputting ions having a specific energy from the ion beam output from the acceleration tube. The method comprises: during an acceleration mode of operation in which the ion beam is accelerated by the acceleration tube, controlling an acceleration voltage to be applied to the acceleration tube, in such a manner that it is prevented from becoming 0 kV; and, during a deceleration mode of operation in which the ion beam is decelerated by the acceleration tube, controlling an extraction voltage for extracting an ion beam from the ion source, and a deceleration voltage to be applied to the acceleration tube, in such a manner that respective values thereof become different from each other.

In this method, even if discharge occurs in an extraction electrode for extracting an ion beam from the ion source, non-desired ions generated in the ion source can be separated through the energy separator, during both the acceleration mode of operation and the deceleration mode of operation, so that it becomes possible to allow only desired ions to reach a target. Detailed functions will be described later.

According to another aspect of the present invention, there is provided a method of controlling an ion implantation apparatus, wherein the ion implantation apparatus includes: a mass separator for sorting out and outputting ions having a specific mass number and valence from an ion beam extracted from an ion source; an acceleration tube for accelerating or decelerating the ion beam output from the mass separator; and an energy separator for sorting out and outputting ions having a specific energy from the ion beam output from the acceleration tube. The method comprises, during switching between a deceleration mode of operation in which the ion beam is decelerated by the acceleration tube, and an acceleration mode of operation in which the ion beam is accelerated by the acceleration tube, controlling an extraction voltage for extracting an ion beam from the ion source, and a deceleration voltage to be applied to the acceleration tube, in such a manner that respective values thereof become different from each other.

This method can solve a problem that, if, during switching between the deceleration mode of operation and the acceleration mode of operation, the extraction voltage and the deceleration voltage become equal to each other and further discharge occurs in an extraction electrode, non-desired ions will reach a target. Detailed functions will be described later.

According to another aspect of the present invention, there is provided a method of controlling an ion implantation apparatus, wherein the ion implantation apparatus includes: a mass separator for sorting out and outputting ions having a specific mass number and valence from an ion beam extracted from an ion source; an acceleration tube for accelerating or decelerating the ion beam output from the mass separator; and an energy separator for sorting out and outputting ions having a specific energy from the ion beam output from the acceleration tube. The method comprises, during switching between a deceleration mode of operation in which the ion beam is decelerated by the acceleration tube, and an acceleration mode of operation in which the ion beam is accelerated by the acceleration tube, controlling an acceleration voltage to be applied to the acceleration tube, in such a manner that it is prevented from becoming 0 kV.

This method can solve a problem that, if, during switching between the deceleration mode of operation and the acceleration mode of operation, the acceleration voltage becomes 0 kV, and further discharge occurs in an extraction electrode, non-desired ions will reach a target.

Effect of the Invention

The method of the present invention makes it possible to prevent the occurrence of a situation where, due to discharge of the extraction electrode, an ion beam generated in the ion source to contain a plurality of types of ions reaches a target, and ions having a mass and energy other than desired values are implanted into the target.

DESCRIPTION OF EMBODIMENTS

With reference to the drawings, the present invention will now be described based on an ion implantation apparatus control method according to one embodiment thereof.

Figure 1:
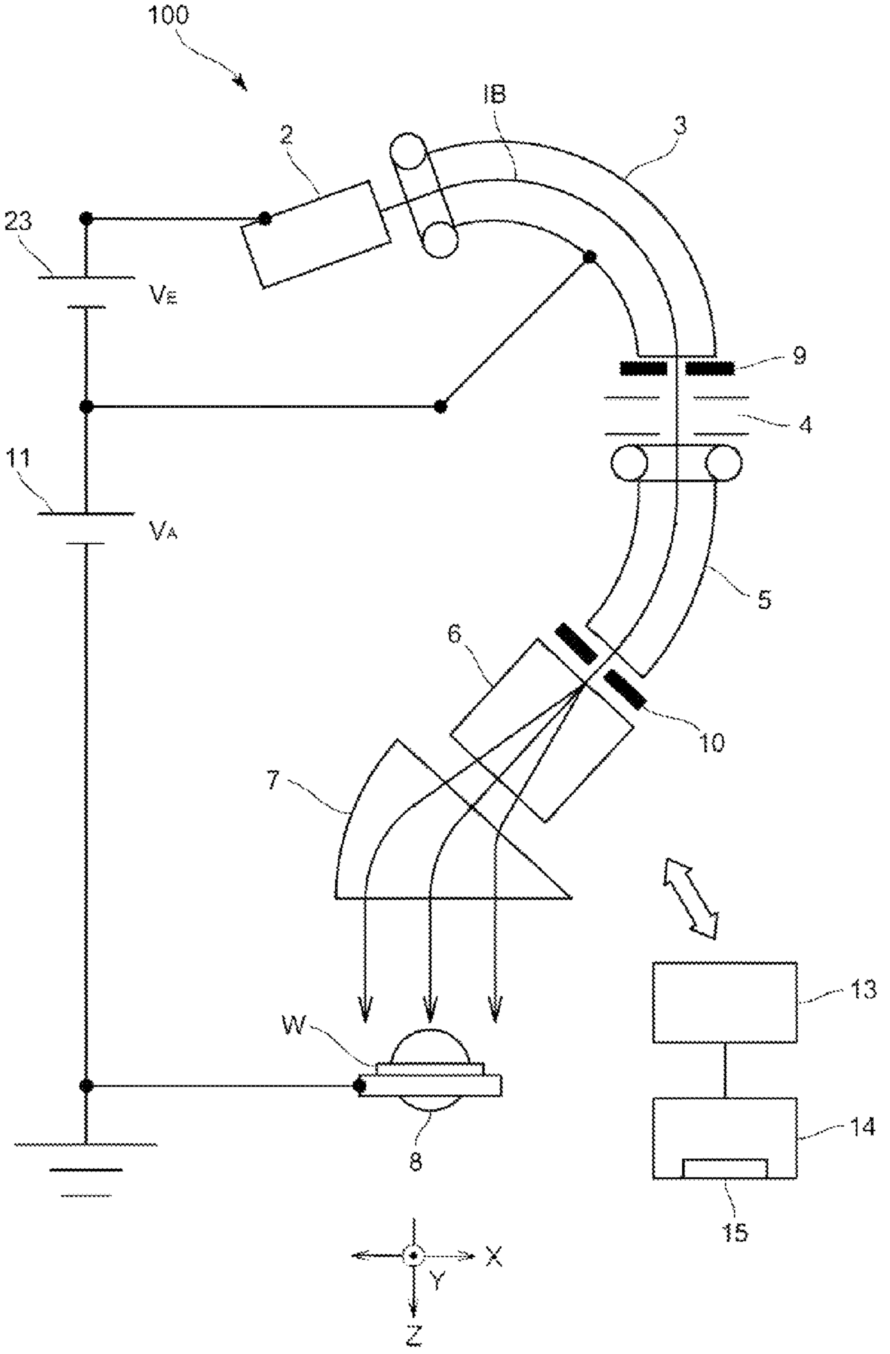
FIG. 1 is a schematic diagram illustrating a configuration of an ion implantation apparatus for implementing a control method according to one embodiment of the present invention, during an acceleration mode of operation.
Figure 3:
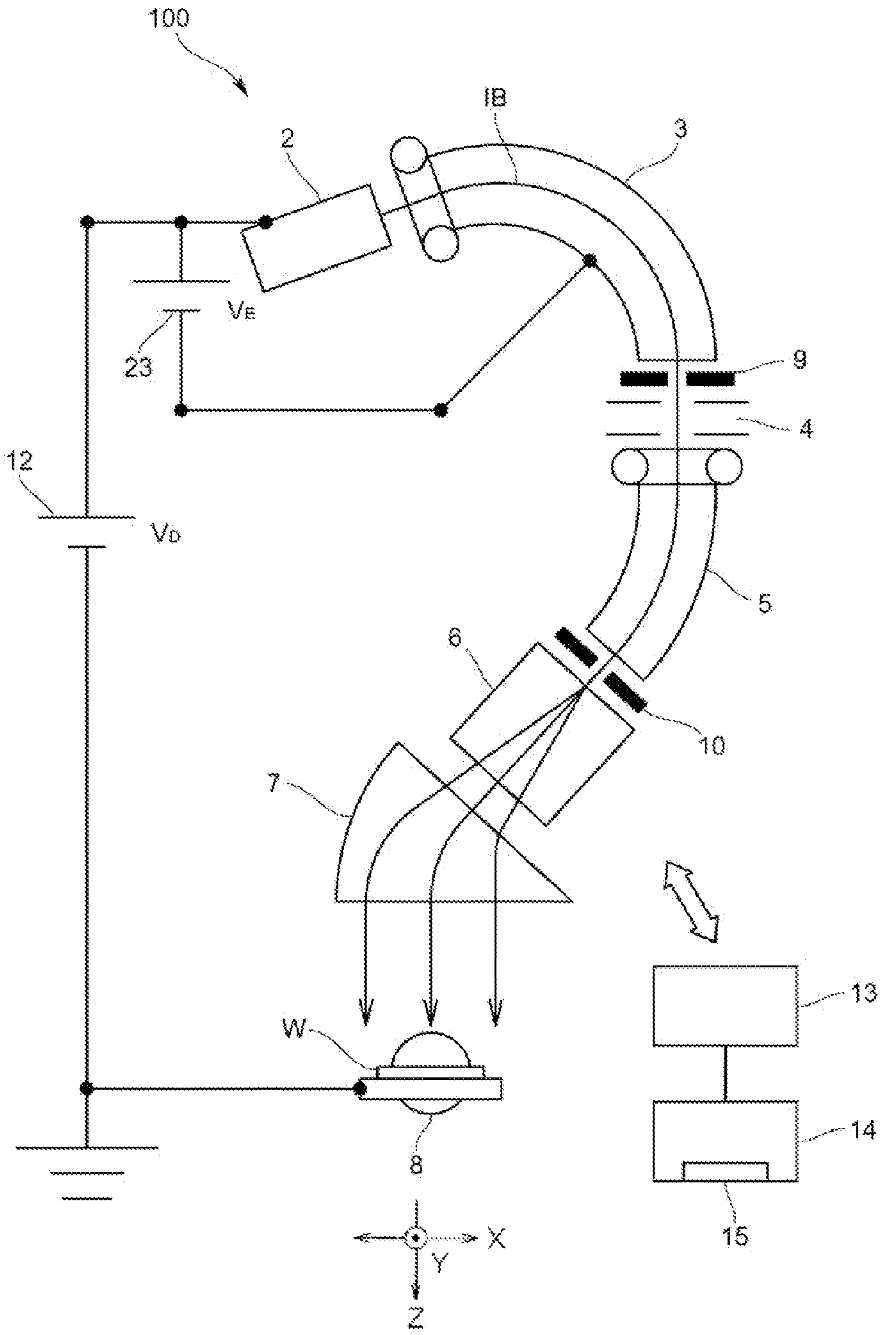
FIG. 3 is a schematic diagram illustrating a configuration of the ion implantation apparatus during a deceleration mode of operation.

As illustrated in FIGS. 1 and 3, an ion implantation apparatus 100 for implementing the method according to one embodiment of the present invention comprises: an ion source 2 from which an ion beam IB is extracted; a mass separation magnet 3 provided downstream of the ion source 2 to serve as a mass separator for sorting out and outputting a specific ion species (this ion species is identified by a mass number and a valence) from the ion beam IB extracted from the ion source 2; an acceleration tube 4 provided downstream of the mass separation magnet 3 to accelerate or decelerate the ion beam IB output from the mass separation magnet 3; an energy separation magnet 5 provided downstream of the acceleration tube 4 to serve as an energy separator for sorting out and outputting ions having a specific energy from the ion beam IB output from the acceleration tube 4; a scanning magnet 6 provided downstream of the energy separation magnet 5 to scan the ion beam IB output from the energy separation magnet 5, magnetically and one-dimensionally (in an X-axis direction along the drawing sheet in FIG. 1); a beam parallelizing magnet 7 provided downstream of the scanning magnet 6 to bend back the ion beam IB output from the scanning magnet 6 to become parallel to a reference axis (axis along a Z-axis direction) to perform parallel scanning of the ion beam IB in cooperation with the scanning magnet 6; and a scanning mechanism 8 provided downstream of the beam parallelizing magnet 7 to mechanically scan a target W (e.g., wafer) in a direction (a Y-axis direction perpendicular to the drawing sheet in FIG. 1) substantially perpendicular to the scanning direction of the ion beam IB in the scanning magnet 6, within an irradiation region of the ion beam IB output from the beam parallelizing magnet 7. The ion beam IB is emitted onto the target W to perform ion implantation.

The mass separation magnet 3 has a mass separation slit 9 provided at an ion outlet thereof to allow only the ions sorted by the mass separation magnet 3 to pass therethrough, and the energy separation magnet 5 has an energy separation slit 10 provided at an ion outlet thereof to allow only the ions sorted by the energy separation magnet 5 to pass therethrough.

Figure 2:
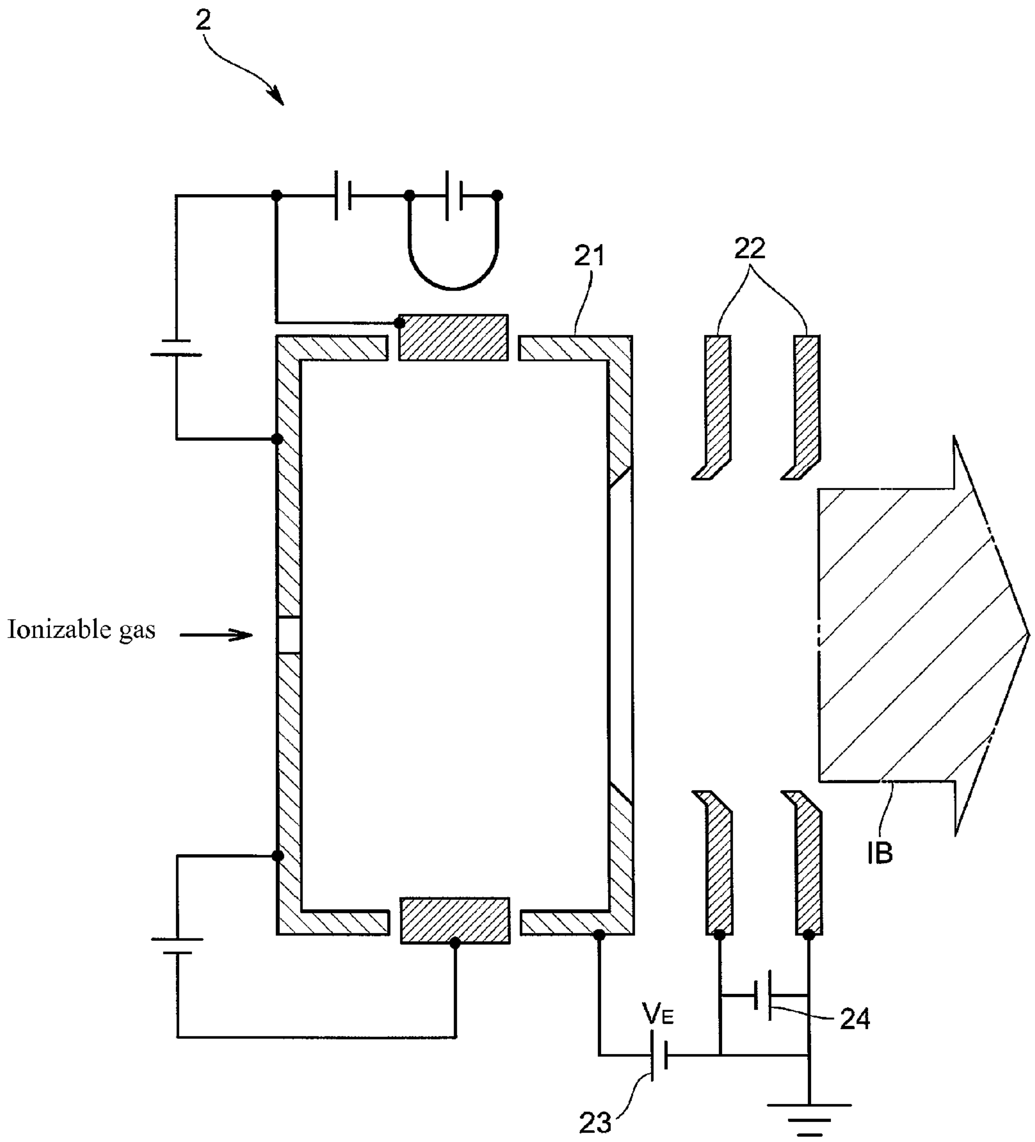
FIG. 2 is a schematic diagram illustrating a configuration of an ion source.

As illustrated in FIG. 2, the ion source 2 comprises a plasma generation section 21 for generating plasma by means, for example, of ECR (Electron-Cyclotron Resonance) discharge, and an extraction electrode 22 for extracting an ion beam IB from the plasma generation section 21 by an action of an electric field, wherein an extraction voltage $V_E$ is applied therebetween from a DC extraction power supply 23 disposed such that a positive terminal thereof is connected to the plasma generation section 21. In FIG. 2, a suppression power supply 24 is connected between first and second sub-electrodes of the extraction electrode 22 from the left, to prevent back-flow of electrons generated downstream of the extraction electrode 22.

The acceleration tube 4 has a plurality of electrodes arranged in a multi-stage, wherein an acceleration voltage $V_A$ is applied between opposite ends thereof from a DC acceleration-mode power supply 11 disposed such that a positive terminal thereof is connected to an upstream side of the acceleration tube. A downstreammost one of the electrodes in the accelerator tube 4 is grounded. As used herein, the term "acceleration mode of operation" means an operating method designed such that ions extracted from the ion source 2 through the extraction electrode 22 are accelerated by the acceleration-mode power source 11, to have a required beam energy. The beam energy to be obtained through the acceleration mode of operation is determined by a sum of the extraction voltage $V_E$ and the acceleration voltage $V_A$.

On the other hand, in a deceleration mode of operation, the acceleration-mode power supply 11 is detached from the acceleration tube 4, and a deceleration-mode voltage $V_D$ is applied between the plasma generation section 21 of the ion source 2 and the ground from a DC deceleration-mode power supply 12 disposed such that a positive terminal thereof is connected to the plasma generation section 21, as illustrated in FIG. 3. In a recipe requiring a beam energy, for example, of about 40 keV or less, if the extraction voltage $V_E$ is set to about 40 kV or less, a current of an ion beam extracted from the ion source 2 becomes excessively low. The term "deceleration mode of operation" means an operating method designed such that the extraction voltage $V_E$ is set to a relatively high value enough to ensure a required ion beam current, and then the ion beam is decelerated by the deceleration—mode power supply 12, to have the required beam energy. The beam energy to be obtained through the deceleration mode of operation is determined by the deceleration-mode voltage $V_D$.

As illustrated in FIGS. 1 and 3, the ion implantation apparatus 100 further comprises a control unit 13 for generally governing control of the ion implantation apparatus 100, and a man-machine controller 14 for performing input and output processing for an operator. The man-machine controller 14 has a display unit 15.

Based on the above configuration, an ion beam IB having a desired ion species and energy can be parallel-scanned and emitted while mechanically scanning the target W, to evenly implant ions into the entire surface of the target W.

When the above ion implantation apparatus 100 is normally operated, a magnetic flux density in each of the mass separation magnet 3 and the energy separation magnet 5 of the ion implantation apparatus 100 is set to allow only desired ions to pass therethrough, so that, a plurality of types of ions are generated in the ion source 2, non-desired ions are not implanted into the target W. A magnetic flux density B and a mass value m in each of the mass separation magnet 3 and the energy separation magnet 5 can be expressed by the following formula:

$$B = \frac{1}{R}\sqrt{\frac{2mV}{qe}} \qquad (1)$$

In the above formula, R represents curvature radius, q represents ion charge number, V represents voltage, and e represents quantum of electricity.

During the acceleration mode of operation (see FIG. 1) of the ion implantation apparatus 100 in this embodiment, the acceleration voltage $V_A$ to be applied to the acceleration tube 4 is controlled to be prevented from becoming 0 kV.

During the acceleration mode of operation, if discharge occurs in the extraction electrode 22 under the condition that the acceleration voltage $V_A$ is zero (0 kV), a small amount of non-desired ions will reach the target W within an extremely short period of time.

For example, in cases where the extraction voltage $V_E$ is 40 kV, if discharge occurs in the extraction electrode 22, the extraction voltage $V_E$ will be instantaneously changed from 40 kV to 0 kV.

When the acceleration voltage $V_A$ is zero (0 kV), the energy separation magnet 5 has a magnetic flux density B which allows ions having an energy determined by the extraction voltage $V_E$ to pass through the energy separation slit 10. Thus, if discharge occurs in the extraction electrode 22, there are ions (non-desired ions) passing through the energy separation slit 10, and the ions will pass through the energy separation slit 10. Consequently, non-desired ions will reach the target W.

On the other hand, when the acceleration voltage $V_A$ is not 0 kV, the energy separation magnet 5 has a magnetic flux density B which allows ions having an energy determined by a sum of the extraction voltage $V_E$ and the acceleration voltage $V_A$ to pass through the energy separation slit 10. Thus, ions having an energy determined by a sum of the extraction voltage $V_E$ and the acceleration voltage $V_A$ of less than 40 kV cannot pass through the energy separation slit 10. Therefore, even if discharge occurs in the extraction electrode 22, ions having a non-desired mass will never reach the target W.

Furthermore, during the deceleration mode of operation (see FIG. 3) of the ion implantation apparatus 100 in this embodiment, the extraction voltage $V_E$ for extracting an ion beam IB from the ion source 2, and deceleration-mode voltage $V_D$ to be applied to the acceleration tube 4, are controlled such that respective values thereof become different from each other (i.e., VE≠VD).

During the deceleration mode of operation, if discharge occurs in the extraction electrode 22 under the condition that the extraction voltage $V_E$ has a value equal to that of the deceleration-mode voltage $V_D$, non-desired ions will pass through the mass separation slit 9. The energy separation magnet 5 has a magnetic flux density which allows ions having an energy determined by the deceleration-mode voltage $V_D$ (=the extraction voltage $V_E$) to pass through the energy separation slit 10, so that the ions passing through the mass separation slit 9 will also pass through the energy separation slit 10. Consequently, non-desired ions will reach the target W.

On the other hand, in cases where the extraction voltage $V_E$ is set to a value different from that of the deceleration-mode voltage $V_D$, for example, in cases where the extraction voltage $V_E$ is set to 50 kV and the deceleration-mode voltage $V_D$ is set to 30 kV, if discharge occurs in the extraction electrode 22, the extraction voltage $V_E$ will be changed from 50 kV to 0 kV. In this situation, a condition (the following formula) is satisfied that the term within the root in the formula (1) is constant, so that, as the extraction voltage $V_E$ is changed due to the discharge, a mass of each ion passing through the mass separation slit 9 is changed in reverse proportion thereto.

$$\frac{2mV}{qe} = const \qquad (2)$$

The magnetic flux density B of the energy separation magnet 5 is set to allow only ions having an energy determined by the deceleration-mode voltage $V_D$ (30 kV) and passing through the mass separation slit 9 during no discharge of the extraction electrode 22 to pass through the energy separation slit 10.

Subsequently, even if discharge occurs in the extraction electrode 22, the energy of each ion to be allowed to pass through the energy separation slit 10 is not changed. Therefore, ions to be allowed to pass through the energy separation slit 10 correspond to ions passing through the energy separation slit 10 during no discharge of the extraction electrode 22, so that non-desired ions never reach the target W.

Figure 4:
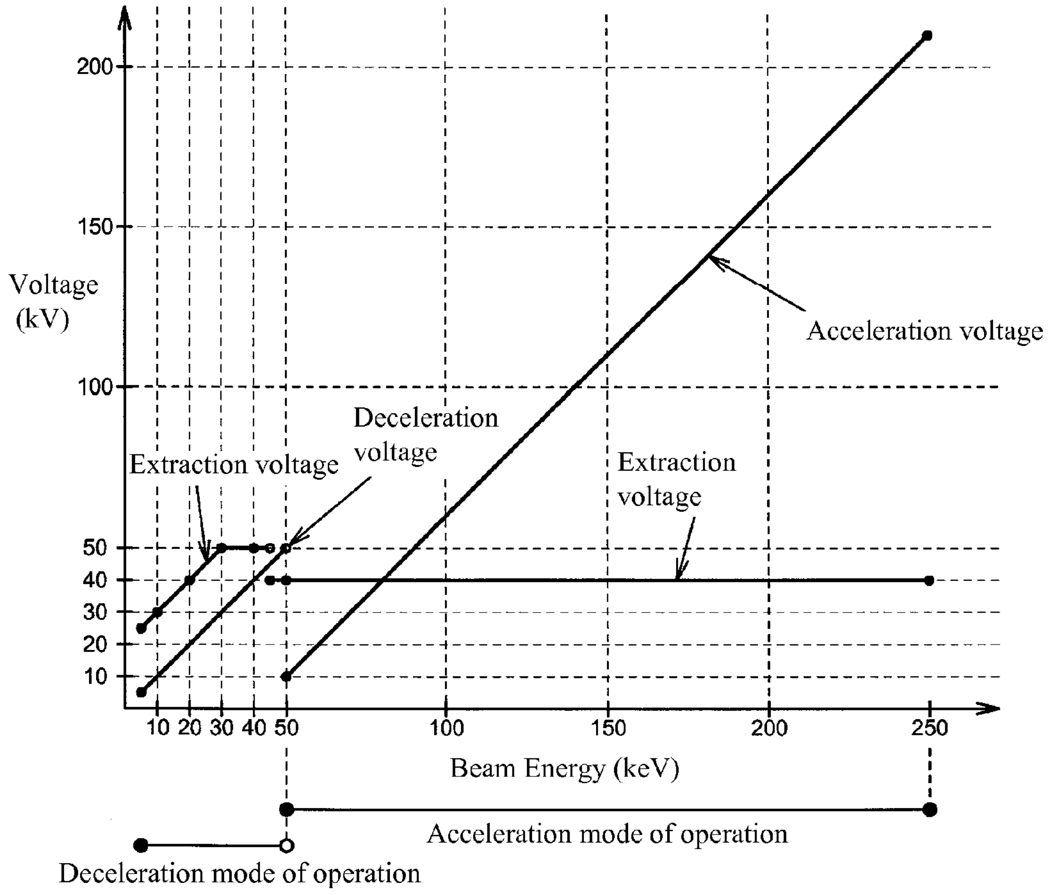
FIG. 4 is a graph illustrating one example of a voltage and a beam energy during each mode of operation.

In this embodiment, as illustrated in FIG. 4, during switching from the deceleration mode of operation to the acceleration mode of operation, or during switching from the acceleration mode of operation to the deceleration mode of operation, the acceleration voltage $V_A$ is controlled to be prevented from becoming 0 kV, and the extraction voltage $V_E$ and the deceleration-mode voltage $V_D$ are controlled such that respective values thereof become different from each other.

As above, the control method for the ion implantation apparatus 100 according to this embodiment makes it possible to prevent the occurrence of a situation where, due to discharge of the extraction electrode 22, an ion beam IB generated in the ion source 2 to contain a plurality of types of ions reaches the target W, and ions having a mass and energy other than desired values are implanted into the target W.

The present invention is not limited to the above embodiment. For example, in the above embodiment, during the acceleration mode of operation, an operator controls the acceleration voltage such that it is prevented from becoming 0 kV, and, during the deceleration mode of operation, an operator controls the extraction voltage and the deceleration voltage such that respective values thereof become different from each other. Alternatively, the control unit may be configured to control the acceleration voltage, the extraction voltage and the deceleration voltage in the above manner, based on a predetermined recipe input into the man-machine controller by an operator.

It is to be understood that various changes and modifications may be made in the above embodiment without departing from the spirit and scope of the invention as set forth in appended claims.

Explanation of Codes

100: ion implantation apparatus
IB: ion beam
2: ion source
3: mass separation magnet (mass separator)
4: acceleration tube
5: energy separation magnet (energy separator)
6: scanning magnet
7: beam parallelizing magnet
8: scanning mechanism
9: mass separation slit
10: energy separation slit
11: acceleration-mode power supply
12: deceleration-mode power supply
13: control unit
14: man-machine controller
15: display unit

What is claimed is:

1. A method of controlling an ion implantation apparatus, the ion implantation apparatus including:

a mass separator for sorting out and outputting ions having a specific mass number and valence from an ion beam extracted from an ion source;

an acceleration tube for accelerating or decelerating the ion beam that is output from the mass separator; and an energy separator for sorting out and outputting ions having a specific energy from the ion beam that is output from the acceleration tube, the method comprising, during an acceleration mode of operation in which the ion beam is accelerated by the acceleration tube, controlling an acceleration voltage to be applied to the acceleration tube, in such a manner that it is prevented from becoming 0 kV, which prevents undesired ions from being implanted into the target, when discharge occurs in the extraction electrode.

2. A method of controlling an ion implantation apparatus, the ion implantation apparatus including:

a mass separator for sorting out and outputting ions having a specific mass number and valence from an ion beam extracted from an ion source;

an acceleration tube for accelerating or decelerating the ion beam that is output from the mass separator; and an energy separator for sorting out and outputting ions having a specific energy from the ion beam that is output from the acceleration tube, the method comprising, during a deceleration mode of operation in which the ion beam is decelerated by the acceleration tube, controlling an extraction voltage for extracting an ion beam from the ion source, and a deceleration voltage to be applied to the acceleration tube, in such a manner that respective values thereof become different from each other, which allows only desired ions to reach the target, when discharge occurs in the extraction electrode.

3. A method of controlling an ion implantation apparatus, the ion implantation apparatus including:

a mass separator for sorting out and outputting ions having a specific mass number and valence from an ion beam extracted from an ion source;

an acceleration tube for accelerating or decelerating the ion beam that is output from the mass separator; and an energy separator for sorting out and outputting ions having a specific energy from the ion beam that is output from the acceleration tube, the method comprising, during an acceleration mode of operation in which the ion beam is accelerated by the acceleration tube, controlling an acceleration voltage to be applied to the acceleration tube, in such a manner that it is prevented from becoming 0 kV, which prevents undesired ions from being implanted into the target, when discharge occurs in the extraction electrode; and, during a deceleration mode of operation in which the ion beam is decelerated by the acceleration tube, controlling an extraction voltage for extracting an ion beam from the ion source, and a deceleration voltage to be applied to the acceleration tube, in such a manner that respective values thereof become different from each other, when discharge occurs in the extraction electrode.

4. A method of controlling an ion implantation apparatus, the ion implantation apparatus including:

a mass separator for sorting out and outputting ions having a specific mass number and valence from an ion beam extracted from an ion source;

an acceleration tube for accelerating or decelerating the ion beam that is output from the mass separator; and an energy separator for sorting out and outputting ions having a specific energy from the ion beam that is output from the acceleration tube, the method comprising, during switching between a deceleration mode of operation in which the ion beam is decelerated by the acceleration tube, and an acceleration mode of operation in which the ion beam is accelerated by the acceleration tube, controlling an extraction voltage for extracting an ion beam from the ion source, and a deceleration voltage to be applied to the acceleration tube, in such a manner that respective values thereof become different from each other, which allows only desired ions to reach the target, when discharge occurs in the extraction electrode.

5. A method of controlling an ion implantation apparatus, the ion implantation apparatus including:

a mass separator for sorting out and outputting ions having a specific mass number and valence from an ion beam extracted from an ion source;

an acceleration tube for accelerating or decelerating the ion beam that is output from the mass separator; and an energy separator for sorting out and outputting ions having a specific energy from the ion beam that is output from the acceleration tube, the method comprising, during switching between a deceleration mode of operation in which the ion beam is decelerated by the acceleration tube, and an acceleration mode of operation in which the ion beam is accelerated by the acceleration tube, controlling an acceleration voltage to be applied to the acceleration tube, in such a manner that it is prevented from becoming 0 kV, which prevents undesired ions from being implanted into the target, when discharge occurs in the extraction electrode.

* * * * *